(12) United States Patent
Lee

(10) Patent No.: US 6,246,865 B1
(45) Date of Patent: Jun. 12, 2001

(54) DEVICE AND METHOD FOR CONTROLLING DISTORTION CHARACTERISTIC OF PREDISTORTER

(75) Inventor: Dong-Woo Lee, Busan (KR)

(73) Assignee: SamSung Electronics Co., Ltd., Suwon (KR)

(*) Notice: Subject to any disclaimer, the term of this patent is extended or adjusted under 35 U.S.C. 154(b) by 0 days.

(21) Appl. No.: 08/789,232

(22) Filed: Feb. 4, 1997

(51) Int. Cl.[7] .............................. H03C 1/62; H01Q 11/12; H03K 7/00; H04K 1/02
(52) U.S. Cl. .................... 455/115; 332/107; 375/296; 455/126
(58) Field of Search .................... 332/107, 123, 332/159, 160, 124; 375/296, 297; 455/63, 67.3, 114, 115, 126, 70, 69; 330/149, 52

(56) References Cited

U.S. PATENT DOCUMENTS

| | | | |
|---|---|---|---|
| 4,412,185 | * 10/1983 | Gerard | 330/149 |
| 5,142,240 | * 8/1992 | Isota et al. | 330/149 |
| 5,262,734 | * 11/1993 | Dent et al. | 330/52 |
| 5,524,285 | * 6/1996 | Wray et al. | 455/126 |
| 5,678,198 | * 10/1997 | Lemson | 455/67.1 |
| 5,867,065 | * 2/1999 | Leyendecker et al. | 330/149 |
| 5,913,172 | * 6/1999 | Mc Cabe et al. | 455/503 |
| 5,923,712 | * 7/1999 | Leyendecker et al. | 375/297 |

* cited by examiner

Primary Examiner—Fan Tsang
Assistant Examiner—Sheila Smith
(74) Attorney, Agent, or Firm—Robert E. Bushnell, Esq.

(57) ABSTRACT

A device and a method for meeting the distortion characteristic of a predistorter in accordance with the distortion characteristic of an output amplifier in a transmitter. The device controls the non-linear distortion characteristic of a predistorter in a radio communication transmitter which includes the predistorter for beforehand generating the non-linear distortion characteristic in opposition to non-linear distortion characteristics arising in an output amplifier, and up-converter for converting an output frequency of the predistorter into a radio frequency bandpass and outputting the converted frequency to the output amplifier. The device includes: a monitoring unit for monitoring the output level of the output amplifier; a storing unit for beforehand storing the non-linear distortion characteristics of the predistorter as digital data; a distortion controller for outputting and controlling given non-linear distortion characteristic digital data stored in the storing unit in correspondence with the output level of the monitoring unit; and a digital/analog converter for converting the non-linear distortion characteristic digital data outputted by the distortion controller into an analog signal and providing the converted data to the predistorter.

24 Claims, 4 Drawing Sheets

DEVICE AND METHOD FOR CONTROLLING DISTORTION CHARACTERISTIC OF PREDISTORTER

BACKGROUND OF THE INVENTION

1. Field of the Invention

The present invention relates to a transmitter of a radio communication system and, specifically, to a device for controlling distortion characteristic of a predistorter which compensates the distortion of a transmitting signal by using ready-only memory (ROM) data, and to a method therefor.

2. Description of the Related Art

A non-linear characteristic generated in a high output transmitter of a radio transmitting system brings about the distortion of a transmitting signal, thereby causing the deterioration of the transmitting characteristic. For the sake of compensating the above deterioration, a non-linear distortion characteristic in opposition to the non-linear distortion characteristic caused in a high output amplifier of the above transmitter is beforehand generated in an input terminal of the above transmitter. The non-linear distortion characteristic generated in the predistorter reciprocally cancels the distortion characteristic caused in the high output amplifier disposed at a rear terminal of the predistorter. The output level of the high output amplifier for use in the radio transmitting system is adjusted by the input level of a counterpart's receiver, that is, the transmitting system has an automatic power control function. At this time, the distortion characteristic of the high output amplifier is varied according to the variation of the output level and, accordingly, the distortion characteristic of the predistorter is varied.

FIG. 1 is a detailed block diagram showing the construction of a general predistorter 1, and FIG. 2 is a diagram showing a transmitter for outputting a linear radio signal by using the predistorter of FIG. 1. In this instance, the predistorter 1 varies its distortion characteristic depending on the output level thereof. Here, it is a distortion control voltage Vc that varies the distortion characteristic of the predistorter 1.

An explanation on the operation of the predistorter 1 will be given briefly with reference to FIG. 1. The predistorter 1 receives a modulation signal a as an input signal thereof. Then, the received modulation signal a is amplified in a first amplifier 2 to have enough distortion in a distortion generator 12. Then, a power divider 4 divides the power in a delay compensator 6 and the distortion generator 12. The distortion generator 12 has its third distortion characteristic and then performs the distortion. Thereafter, an output signal of the distortion generator 12 is applied to a distortion adjuster 14 to adjust the size and the phase of the distortion, so that the adjusted size and phase can be combined with a delay compensated signal in the delay compensator 6 through a power coupler 8. At this moment, the distortion signal regarding the delay compensated signal has a phase difference of 180° relative to the distortion characteristic of an output amplifier to be compensated. After the output of the power coupler 8 is amplified in a second amplifier 10 as much as that of the first amplifier 2, the amplified output is outputted as a distorted modulation signal B. The frequency spectrum of both the modulation signal A as the input signal of the power coupler 8 and the distorted modulation signal B as the output signal thereof is illustrated in FIG. 1.

The predistortion process performed in the predistorter 1 of FIG. 1 is naturally achieved in an intermediate frequency band.

With reference to FIG. 2, the distorted signal B outputted from the predistorter 1 of FIG. 1, for example, an intermediate frequency band, is inputted to an up-converter 20, the output C of which is provided to an output amplifier 22 of the radio frequency band, and is canceled with the non-linear distortion characteristic of the output amplifier 22, so that a linear radio signal can be outputted to a directional coupler 24.

At this moment, the distortion control voltage Vc is provided to the predistorter 1 in FIG. 2 to thereby vary the distortion characteristic depending on the output level of the predistorter 1. The processes of generating the distortion control voltage Vc are as follows. The directional coupler 24 divides the output of the output amplifier 22 and applies the divided output to the local down-converter 30. The radio signal outputted from the directional coupler 24 is converted into the intermediate frequency bandpass by the local down-converter 30 and the result is outputted through a bandpass filter 32 as an inter-modulation signal (hereinafter, referred to as IMD). The bandpass filter 32 performs bandpass filtering to minimize the power of the IMD. The IMD signal as the output of the bandpass filter 32 has its power level detected in the power level detector 34. A controller 36 provides the distortion control voltage Vc to the predistorter 1 in response to the detected power.

In the meantime, as depicted in FIG. 2, a local oscillator 28 provides a local oscillation signal and the power divider 26 divides the local oscillation signal of the local oscillator 28 to provide a divide signal to the up-converter 20 and the local down-converter 30.

However, it is a disadvantage that the transmitter as illustrated in FIG. 2, should be indispensably constructed with an additional circuit such as the local down-converter 30, the bandpass filter 32, the power level detector 34 and the controller 36 for the sake of providing to predistorter the distortion control voltage Vc for changing the distortion characteristic in accordance with the output level. Also, it is impossible to softly meeting the distortion characteristics of the predistorter 1 depending on the distortion characteristic of the output amplifier 22.

SUMMARY OF THE INVENTION

It is an object of the present invention to provide a device and a method for softly meeting the distortion characteristic of the predistorter in accordance with the distortion characteristic of an output amplifier in a transmitter.

It is another object of the present invention to provide a device and a method for converting an IMD signal component into digital data in accordance with the variation of the output level of the transmitter, storing the digital data, and controlling the distortion characteristic to generate the distortion control voltage so as to have the distortion in conformity with the variation of the output level.

In order to achieve the above objects, the present invention is provided with a device for controlling the non-linear distortion characteristic of a predistorter in a radio communication transmitter which includes the predistorter for beforehand generating the non linear distortion characteristic in opposition to non-linear distortion characteristic arising in an output amplifier, and an up-converter for converting the output frequency of the predistorter into a radio frequency bandpass and outputting the converted frequency to the output amplifier, the device comprising: a monitoring unit for monitoring the output level of the output amplifier; a storing unit for beforehand storing the non-linear distortion characteristics of the predistorter as digital data; a distortion controller for outputting and controlling given non-linear distortion characteristic digital data stored in the storing unit in correspondence with the output level of the monitoring unit; and a digital analog converter for converting the non-linear distortion characteristic digital data outputted by the distortion controller into an analog signal and providing the converted data to the predistorter.

BRIEF DESCRIPTION OF THE DRAWING

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENT(S)

In the following description, numeral specific details such as components and frequencies of the concrete circuit, are set forth to provide a more through understanding of the present invention. It will be apparent, however, to one skilled in the art that the present invention may be practiced without these specific details. The detailed description on known function and constructions unnecessarily obscuring the subject matter of the present invention will be avoided in the present invention.

Figure 1:
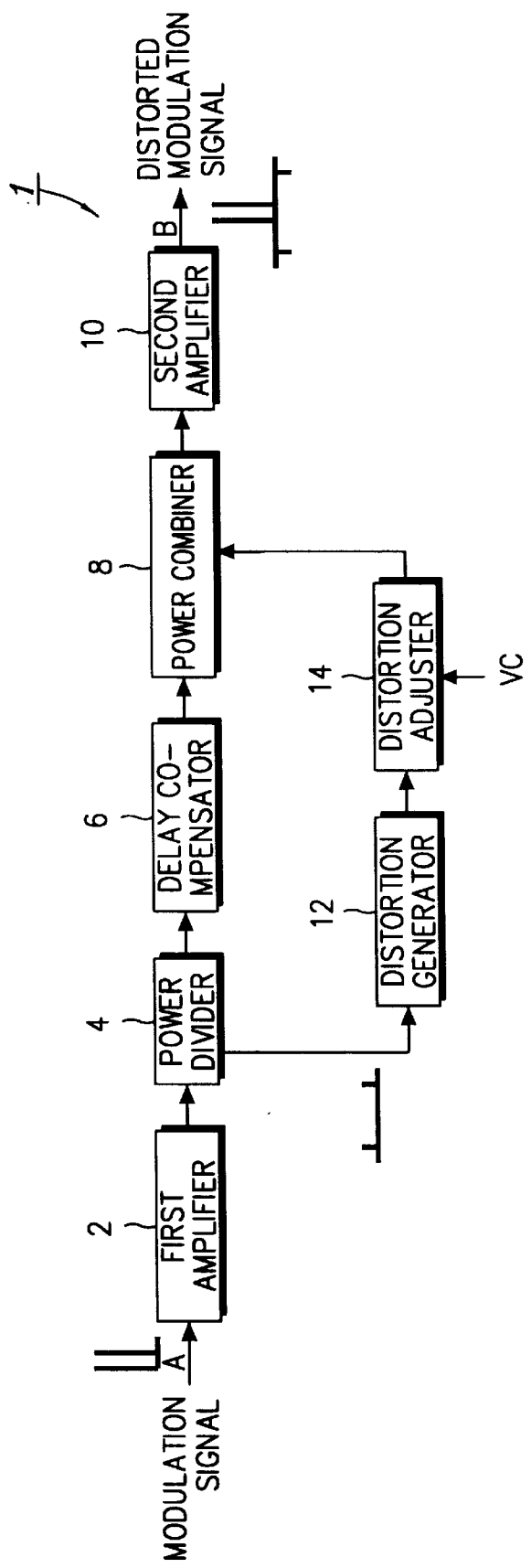
FIG. 1 is a detailed block diagram showing the construction of a general predistorter.
Figure 2:
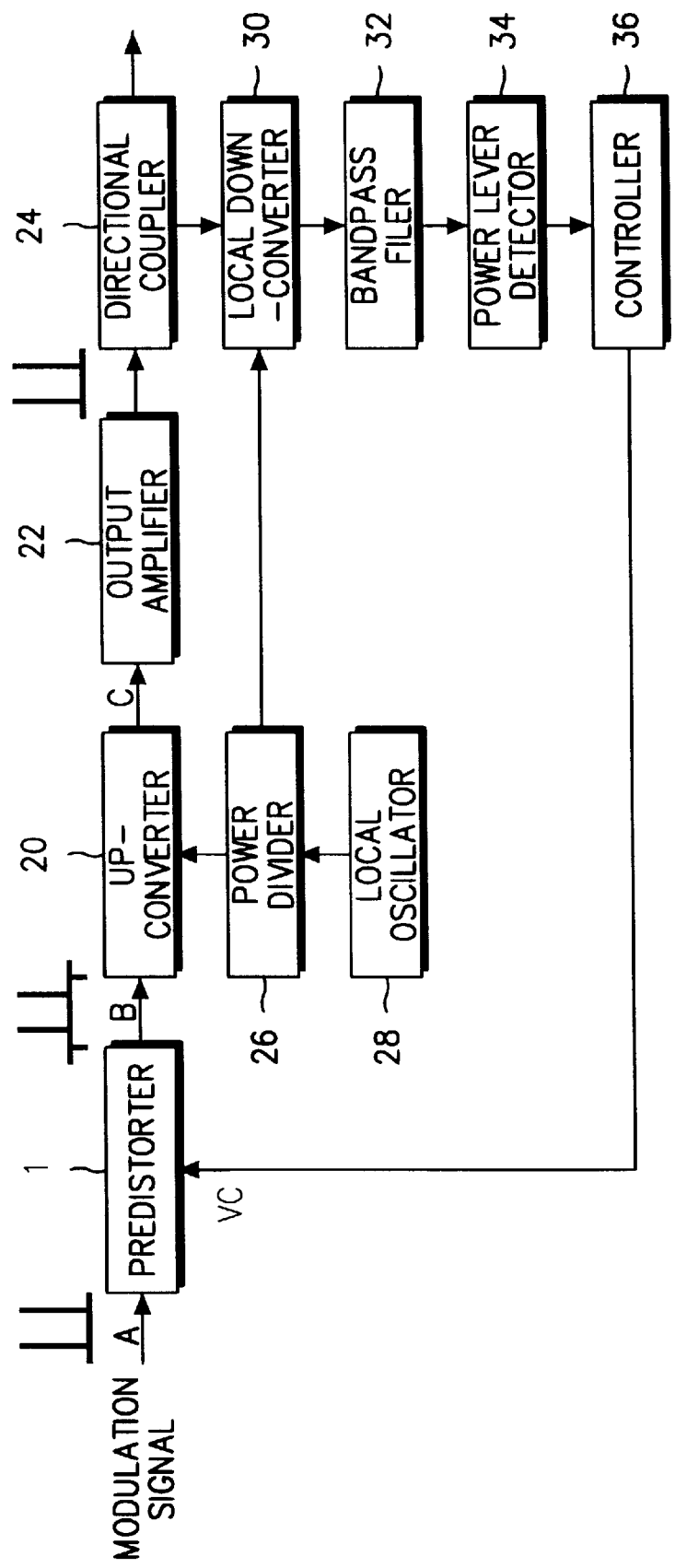
FIG. 2 is a diagram showing the construction of a transmitter for outputting a linear radio signal by using the predistorter of FIG. 1.
Figure 3:
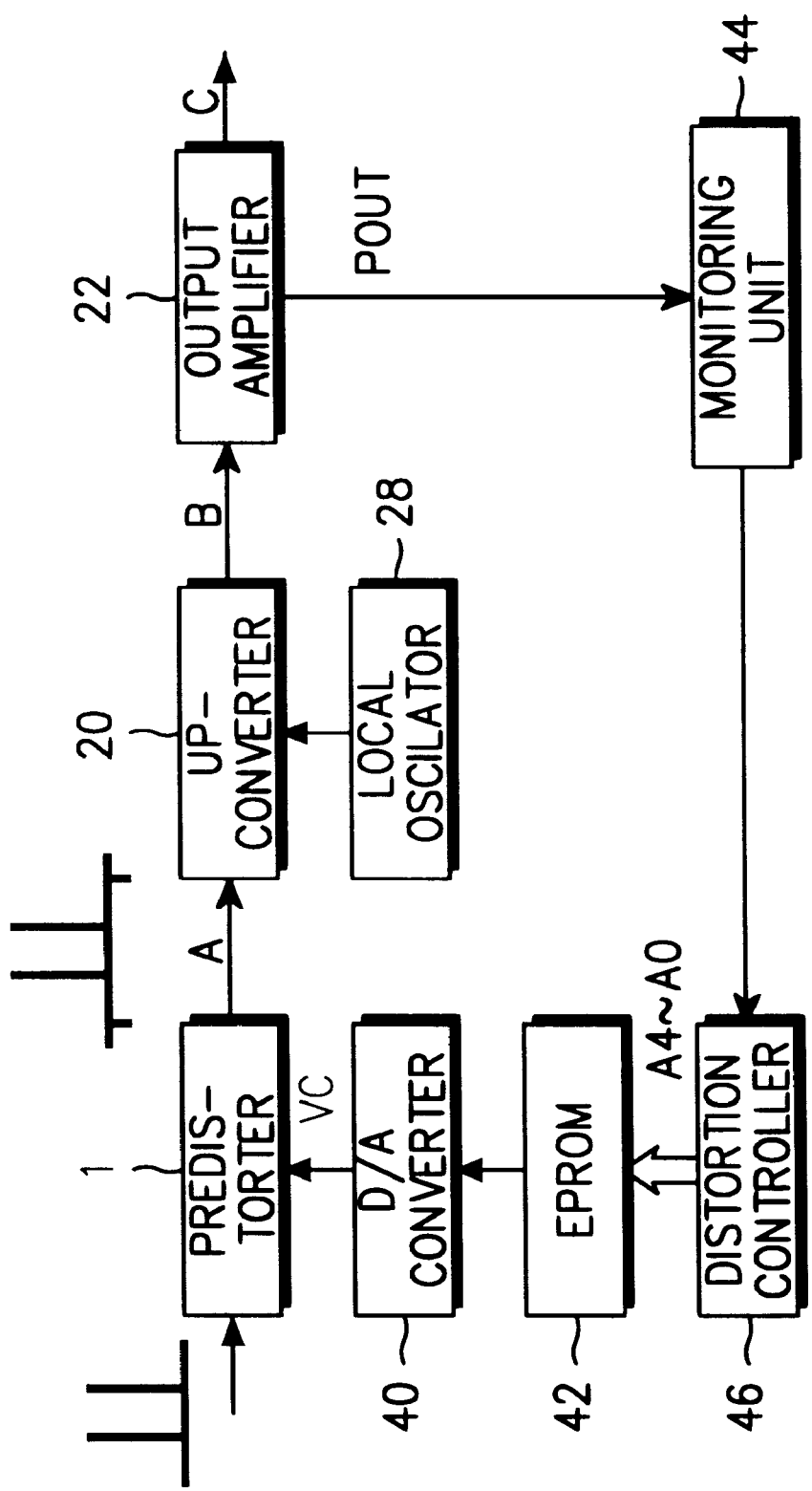
FIG. 3 is a block diagram showing the construction of a radio transmitter for providing a distortion control voltage to a predistorter according to the present invention.

FIG. 3 is a block diagram showing the construction of a radio transmitter for providing a distortion control voltage to a predistorter according to the present invention. The construction of FIG. 3 represented by the predistorter 1, an up-converter 20, an output amplifier 22 and a local oscillator 28 is the same as that of FIG. 1. However, according to the present invention, FIG. 3 further comprises of an EEPROM (electrically erasable and programmable ROM) 42 as a memory device for converting the non-linear distortion characteristic as data and memorizing the data, a D/A (digital/analog) converter 40 for converting output data of the EEPROM 42 into an analog signal and providing the distortion control voltage VC to the predistorter 1, a monitoring unit 44 for monitoring the output of the output amplifier 22, and a distortion controller 46 for controlling the EEPROM 42 for distortion adjustment depending on the monitoring value of the monitoring unit 44.

The present invention, most of all, sets the given output level of the output amplifier 22 by using the output power control signal, measures the distortion control voltage Vc in conformity with the amplitude and the phase of the distortion for compensation of the set output level, and converts the measured voltage into digital data. Regarding the output level of the output amplifier 22, each of the distortion control voltages Vc is measured and the measured voltages are converted into the digital data. Accordingly, when all of the distortion control voltages are converted into the digital data, the digital data is converted into the EEPROM data to thereby be mapped to the EEPROM 42. At this moment, the output power control signal can be used as the address of the EEPROM 42.

In the following table <1>, there are examples in which the output power control signal, the distortion control voltage and the EEPROM data used as the address of the EEPROM 42 are mapped to the EEPROM 42.

TABLE 1

| Output Level | Distortion Control Voltage | Address | | | | | EEPROM Data |
|---|---|---|---|---|---|---|---|
| (dBm) | (Vc) | A4 | A3 | A2 | A1 | A0 | (Hexa) |
| 31 | −12 | 1 | 1 | 1 | 1 | 1 | FF |
| 30 | −9.45 | 1 | 1 | 1 | 1 | 0 | C8 |
| 29 | −7.35 | 1 | 1 | 1 | 0 | 1 | 9C |
| 28 | −5.75 | 1 | 1 | 0 | 0 | 0 | 7B |
| 27 | −4.60 | 1 | 1 | 0 | 1 | 1 | 61 |
| 26 | −3.70 | 1 | 1 | 0 | 1 | 0 | 4E |
| 25 | −3.05 | 1 | 1 | 0 | 0 | 1 | 41 |
| 24 | −2.55 | 1 | 1 | 0 | 0 | 0 | 36 |
| 23 | −2.15 | 1 | 0 | 1 | 1 | 1 | 2E |
| 22 | −1.85 | 1 | 0 | 1 | 1 | 0 | 27 |
| 21 | −1.60 | 1 | 0 | 1 | 0 | 1 | 22 |
| 20 | −1.35 | 1 | 0 | 1 | 0 | 0 | 1D |
| 19 | −1.24 | 1 | 0 | 0 | 1 | 1 | 18 |
| 18 | −1.11 | 1 | 0 | 0 | 1 | 0 | 16 |
| 17 | −1.02 | 1 | 0 | 0 | 0 | 1 | 12 |
| 16 | −0.86 | 1 | 0 | 0 | 0 | 0 | 0C |
| 15 | 0 | 0 | 1 | 1 | 1 | 1 | 00 |
| 14 | 0 | 0 | 1 | 1 | 1 | 0 | 00 |
| 13 | 0 | 0 | 1 | 1 | 0 | 1 | 00 |
| 12 | 0 | 0 | 1 | 1 | 0 | 0 | 00 |
| 11 | 0 | 0 | 1 | 0 | 1 | 1 | 00 |

Figure 4:
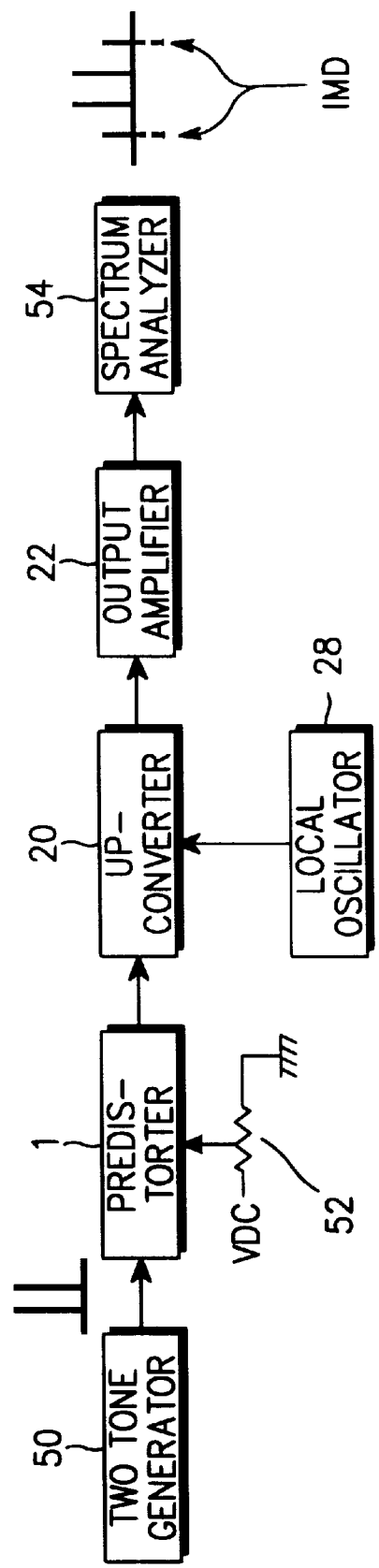
FIG. 4 is a block diagram showing the construction of a predistorter for measuring the distortion control voltage used for converting non-linear characteristic into data.

In the above <Table 1>, in order to obtain the EEPROM data, the distortion control voltage should be measured in correspondence the the output level of the output amplifier 22. In that regard, the present invention includes the system as shown in FIG. 4.

Firstly, after set-up of the system, a two-tone or three tone signal is applied as the modulation signal (input signal) to the predistorter 1. Here, a measurer passively adjusts the resistance value of a variable resistor 52 as the value of the distortion control signal Vc and the power spectrum of the output amplifier 22 is observed via the spectrum analyzer 54. Upon observation by spectrum analyzer 54, the measurer measures the output power control signal upon the IMD suppression rising sufficiently over 60 dBm. The measured output power control signal is changed into a binary logic value and mapped to the EEPROM 42.

The operation of the present invention in performing the predistortion procedure after mapping the data to the EEPROM 42 will be described hereinafter. When the monitoring unit 44 monitors the output level of the output amplifier 22 and provides the monitored level to the distortion controller 46, the distortion controller 46 applies the address as the output power control signal corresponding to this level to the EEPROM 42. Therefore, the EEPROM data in the EEPROM 42 is outputted to the D/A converter 40 responsive to the address as illustrated in <Table 1>. The D/A converter 40 converts the EEPROM data into an analog signal. The analog signal as the distortion control signal Vc corresponding to the EEPROM 42 is provided to the predistorter 1.

As is apparent from the foregoing, the present invention has the following operational effects by using the memory device for providing the distortion control voltage to the predistorter. First, the distortion control voltage of the output level can be obtained without additional circuitry such as a prior art local down-converter, a prior art bandpass filter, a power level detector, and a controller. Second, the distortion characteristic of the predistorter can be smoothly met with the distortion characteristic of the output amplifier. Third, the distortion characteristic arising in the up-converter, the down-converter, and the amplifier can be converted into the digital data, to provide ample compensation.

Therefore, it should be understood that the present invention is not limited to the particular embodiment disclosed herein as the best mode contemplated for carrying out the present invention, but rather that the present invention is not limited to the specific embodiments described in this specification, except as defined in the appended claims.

What is claimed is:

1. A device for controlling a non-linear distortion characteristic of a predistorter in a radio communication transmitter wherein said predistorter is connected via an up-converter to an output amplifier and generates the non-linear distortion characteristic in opposition to non-linear distortion characteristics arising in said output amplifier, and said up-converter converting an output frequency of said predistorter into a radio frequency bandpass and outputting said converted frequency to said output amplifier, said device comprising:

a monitoring unit connected to said output amplifier for monitoring an output level of said output amplifier and providing an output;

a storing unit for storing the non-linear distortion characteristics of said predistorter as digital data;

a distortion controller connected between said monitoring unit and said storing unit for outputting and controlling the digital data stored in said storing unit in correspondence with the output of said monitoring unit; and a digital/analog converter connected between said storing unit and said predistorter for converting the digital data outputted by said distortion controller into an analog signal and providing said analog signal to said predistorter;

wherein said storing unit stores the digital data in a table including the output level of the output amplifier and at least one other quantity.

2. The device as recited in claim 1, wherein said storing unit maps EEPROM data are shown in following <Table 1> in correspondence with said output level of said output amplifier;

| Output Level (dBm) | Distortion Control Voltage (Vc) | A4 | A3 | A2 | A1 | A0 | EEERM Data (Hexa) |
|---|---|---|---|---|---|---|---|
| 31 | −12 | 1 | 1 | 1 | 1 | 1 | FF |
| 30 | −9.45 | 1 | 1 | 1 | 1 | 0 | C8 |
| 29 | −7.35 | 1 | 1 | 1 | 0 | 1 | 9C |
| 28 | −5.75 | 1 | 1 | 0 | 0 | 0 | 7B |
| 27 | −4.60 | 1 | 1 | 0 | 1 | 1 | 61 |
| 26 | −3.70 | 1 | 1 | 0 | 1 | 0 | 4E |
| 25 | −3.05 | 1 | 1 | 0 | 0 | 1 | 41 |
| 24 | −2.55 | 1 | 1 | 0 | 0 | 0 | 36 |
| 23 | −2.15 | 1 | 0 | 1 | 1 | 1 | 2E |
| 22 | −1.85 | 1 | 0 | 1 | 1 | 0 | 27 |
| 21 | −1.60 | 1 | 0 | 1 | 0 | 1 | 22 |
| 20 | −1.35 | 1 | 0 | 1 | 0 | 0 | 1D |
| 19 | −1.24 | 1 | 0 | 0 | 1 | 1 | 18 |
| 18 | −1.11 | 1 | 0 | 0 | 1 | 0 | 16 |
| 17 | −1.02 | 1 | 0 | 0 | 0 | 1 | 12 |
| 16 | −0.86 | 1 | 0 | 0 | 0 | 0 | 0C |
| 15 | 0 | 0 | 1 | 1 | 1 | 1 | 00 |
| 14 | 0 | 0 | 1 | 1 | 1 | 0 | 00 |
| 13 | 0 | 0 | 1 | 1 | 0 | 1 | 00 |
| 12 | 0 | 0 | 1 | 1 | 0 | 0 | 00 |
| 11 | 0 | 0 | 1 | 0 | 1 | 1 | 00 |

3. A method for controlling a non-linear distortion characteristic of a predistorter in a radio communication transmitter, comprising the steps of:

(a) after setup of said transmitter, applying a two-tone signal as a modulation signal to the predistorter;

(b) passively adjusting a value of a distortion control voltage for non-linear distortion characteristics adjustment in said predistorter and applying said adjusted value to said predistorter in response to said step (a);

(c) analyzing a power spectrum of an output level of an output amplifier of said transmitter in response to said steps (a) and (b);

(d) measuring an output power control signal of said output amplifier when suppression of the non-linear distortion characteristics is sufficiently generated in said step (c);

(e) converting said output power signal into digital data corresponding to a distortion control voltage and storing said digital data;

(f) outputting given said digital data in response to said output power control signal of said output amplifier according to a modulation signal applied to said predistorter; and (g) converting said digital data outputted in said step (f) into said distortion control voltage and applying said distortion control voltage to said predistorter.

4. The method as recited in claim 3, wherein said step (d) is performed by measuring said output power control signal of said output amplifier when the power spectrum in said step (c) is suppressed by an amount greater than 60 dBm.

5. A device for storing in a read-only memory digital data for controlling a non-linear distortion characteristic of a predistorter in a radio communication transmitter, said device comprising:

a two-tone generator having an output for generating a two-tone signal having a component identical to a component of a modulation signal applied to said predistorter;

a distortion control signal generator for generating a value of a distortion signal varied by a measure;

a predistorter having inputs connected to said output of said two-tone generator and to said distortion control signal generator for performing predistortion with inputs of said distortion control signal generated by said distortion control signal generator and said two-tone signal generated by said two-tone generator;

a frequency up-converter for converting an output frequency of said predistorter into a radio frequency bandpass and providing an output;

an output amplifier for amplifying the output of said frequency up-converter with a distortion characteristic opposite to said predistortion performed by said predistorter and providing an amplified output; and a spectrum analyzer for analyzing a power level of said output amplifier through a power spectrum, measuring an output power control signal upon generation of largest inter-modulation signal suppression, converting said measured output power control signal into a binary logic value to provide a converter signal, and mapping said converter signal to a read-only memory.

6. The device as recited in claim 1, wherein said at least one other quantity comprises a distortion control voltage.

7. The device as recited in claim 6, wherein said at least one other quantity comprises an address of the storing unit.

8. The device as recited in claim 7, wherein said at least one other quantity comprises electrically erasable and programmable read-only memory data.

9. The device as recited in claim 6, wherein said at least one other quantity comprises electrically erasable and programmable read-only memory data.

10. The device as recited in claim 1, wherein said at least one other quantity comprises an address of the storing unit.

11. The device as recited in claim 10, wherein said at least one other quantity comprises electrically erasable and programmable read-only memory data.

12. The device as recited in claim 1, wherein said at least one other quantity comprises electrically erasable and programmable read-only memory data.

13. In the radio communication transmitter which includes a predistorter, an up-converter connected to said predistorter, and an output amplifier connected to said up-converter;
  a device for controlling a non-linear distortion characteristic of the predistorter, said device comprising:
    monitoring means connected to said output amplifier for monitoring an output level of said output amplifier and providing a monitor output;
    distortion controller means connected to said monitoring means and responding to said monitor output for providing digital data in correspondence to said monitor output; and
    storing means for storing said digital data provided by said distortion controller means, said storing means providing a control output to said predistorter;
  wherein said storing means stores the digital data in a table which includes the output level of the output amplifier and at least one other quantity.

14. The device as recited in claim 13, wherein said at least one other quantity comprises a distortion control voltage.

15. In the radio communication transmitter as recited in claim 14, wherein said at least one other quantity comprises an address of the storing unit.

16. In the radio communication transmitter as recited in claim 15, wherein said at least one other quantity comprises electrically erasable and programmable read-only memory data.

17. In the radio communication transmitter as recited in claim 14, wherein said at least one other quantity comprises electrically erasable and programmable read-only memory data.

18. In the radio communication transmitter as recited in claim 13, wherein said at least one other quantity comprises an address of the storing unit.

19. In the radio communication transmitter as recited in claim 18, wherein said at least one other quantity comprises electrically erasable and programmable read-only memory data.

20. In the radio communication transmitter as recited in claim 13, wherein said at least one other quantity comprises electrically erasable and programmable read-only memory data.

21. In the radio communication transmitter as recited in claim 13, wherein said storing means comprises an electronic erasable programmable read-only memory.

22. In the radio communication transmitter as recited in claim 13, further comprising converter means connected between said storing means and said predistorter for converting the digital data from said storing means to an analog signal comprising said control output provided to said predistorter.

23. In the radio communication transmitter which includes a predistorter, an up-converter connected to said predistorter, and an output amplifier connected to said up-converter;
  a device for controlling a non-linear distortion characteristic of the predistorter, said device comprising:
    two-tone generator means connected to an input of said predistorter for generating a two-tone signal having a component identical to a component of a modulation signal applied to said predistorter;
    distortion control signal generator means connected to said predistorter for generating a distortion control signal which is provided to said predistorter; and
    spectrum analyzer means connected to said output amplifier for analyzing a power level of said output amplifier through a power spectrum, for measuring an output power control signal, for converting said measured output control signal into a binary logic value to provide a converter signal, and for mapping said converter signal to a memory unit.

24. In the radio communication transmitter as recited in claim 23, said distortion control signal generator means comprising a voltage-divider.

* * * * *